(12) United States Patent
Chien et al.

(10) Patent No.: US 6,368,761 B1
(45) Date of Patent: Apr. 9, 2002

(54) PROCEDURE OF ALIGNMENT FOR OPTIMAL WAFER EXPOSURE PATTERN

(75) Inventors: Chen-Fu Chien; Shao-Chung Hsu; Chih-Ping Chen, all of Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/568,323

(22) Filed: May 9, 2000

(51) Int. Cl.⁷ .................................................. G03F 9/00
(52) U.S. Cl. ............................................ 430/22; 430/30
(58) Field of Search ...................................... 430/22, 30

*Primary Examiner*—Christopher G. Young
(74) *Attorney, Agent, or Firm*—Ernest J. Beffel, Jr.; Haynes Beffel & Wolfeld LLP (57) ABSTRACT

Conventionally, efforts to improve the yield of chips produced on a wafer focused on defect reduction. Another approach is optimizing wafer exposure patterns. The present invention includes a computer-based procedure and apparatus to expose cells on the surface of a wafer so as to maximize the number of dies produced from a wafer. The invention is useful in the exposure of six and eight inch wafers, as well as larger wafers.

47 Claims, 8 Drawing Sheets

PROCEDURE OF ALIGNMENT FOR OPTIMAL WAFER EXPOSURE PATTERN

BACKGROUND

1. Field of Invention

The present invention relates to layout of dies on a silicon wafer. Methods are described for optimal use of a stepper to produce dies taking into account the number of exposures required and usable cells produced. The cost of producing chips from a single wafer is reduced by optimal use of the stepper.

2. Related Art

A semiconductor device is fabricated by a lengthy sequence of complex physic-chemical processes on the surface of a single-crystal silicon wafer. The wafer fabrication operations (generally over 500 separate operations) basically include photolithography (the key patterning step), thin-film-etching, thin-film deposition, and oxidation. After a wafer is fabricated, the wafer is then sawed into dies, tested, and the good dies are sent to assembly to be mounted into packages. Extensive discussions of semiconductor manufacturing can be found, for example, in Wolf S., and Tauber, R. N., *Silicon Processing for the VLSI Era: Volume 1 Process Technology*, California: Sunset Beach, Lattice Press (1986). During the photolithography process, the area of the wafer that is exposed each time by the stepper is called a cell. One cell usually contains multiple dies.

Wafer fabs compete by lowering die costs, thereby taking advantage of significant capital investments and fixed operating costs. Many efforts have focused on improved exposure patterns to generate increased yields. That is, profit can be improved by exposing a wafer in a pattern that maximizes the number of gross dies per wafer and minmizig the wasted unused wafer area.

Automation of wafer exposure pattern layout, including driving a stepper pursuant to an optimized exposure pattern has received very little attention. A paper by A. V. Ferris-Prabhu, entitled "An Algebraic Expression to Count the Number of Chips on a Wafer," *IEEE Circuits and Devices Magazine*, pp. 37–39, January 1989, presents an algebraic expression that relates the die number of the wafer diameter and to the geometric parameters of the die. However, this paper does not present a method or apparatus for optimal wafer exposure patterning. Overall, little research has been conducted which identifies or attempts to solve the wafer exposure problem.

SUMMARY OF THE INVENTION

One aspect of the present invention is using a stepper or other wafer patterning device to create a pattern of cells on the surface of a wafer having a baseline, alignment marks, and an unusable border at the edge of the wafer. The alignment marks typically appear on the surface of the wafer. The baseline may be a construct, rather than a surface feature. This method includes defining a pattern on the wafer surface including alignment regions, center and corner regions in quadrants, and creating a pattern on the wafer surface using the defined regions. The alignment regions may extend outward from the reference marks parallel to a baseline. The baseline may pass through the alignment marks or may be parallel to a flat, if the wafer has a flat edge. The cells are preferably test located in the center and corner regions. A preferred cell pattern is selected after evaluation based on the number of exposures and quality of the cells created. One cell may include multiple dies. The quality of cells created may take into account the number of usable dies and location of the dies on the wafer, such as the distance between the dies and the edge of the wafer.

Another aspect of the present invention is a method of transmitting an exposure pattern from a processor to a stepper or other wafer patterning device in accordance with the method described above. According to this aspect of the invention, the pattern is determined in device separate from the stepper and then transmitted to the stepper.

A further aspect of the present invention is preparing an exposure pattern to be communicated from a processor to a stepper or other wafer patterning device. According to this aspect of the invention, the pattern is determined in a device separate from the stepper and recorded on memory. The memory may later be accessed by the stepper or an intermediate device for purposes a transmitting the pattern to the stepper.

The present invention may alternatively be embodied in device, such as a processor with an input for receiving locations of a baseline, first and second referent marks and a border along the edge of wafer, logic utilizing the processor to an define a pattern on surface of the wafer, including alignment regions and center and corner regions, and memory to receive a defined pattern. This device may further include a wafer patterning device in communication with the memory. Both the processor and memory may be incorporated directly into a wafer patterning device.

BRIEF DESCRIPTION OF THE FIGURES

FIGS. 10 to 13 depict layout of cells on a round wafer with alternative alignment mark locations. The regions of the wafer are shown in FIG. 10.

DETAILED DISCUSSION

Figure 1A:
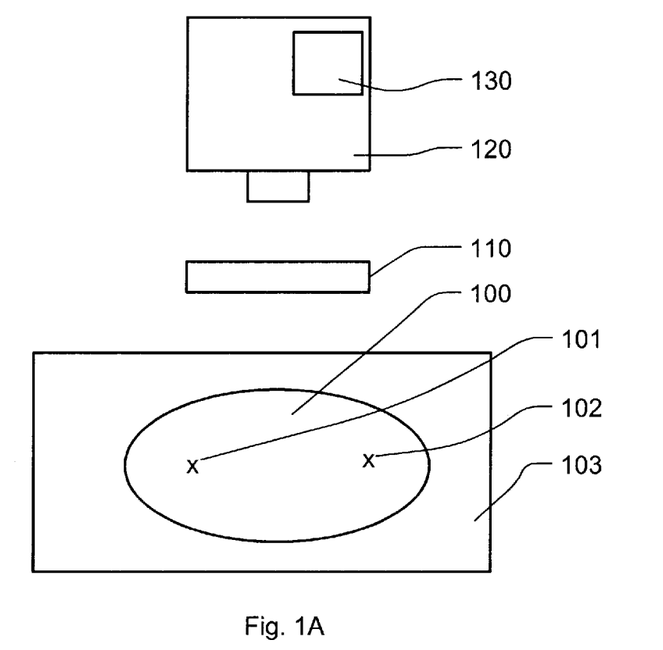
FIGS. 1A, 1B, and 1C depict alternative applications of the present invention to a stepper, direct writer or other wafer patterning apparatus.
Figure 1B:
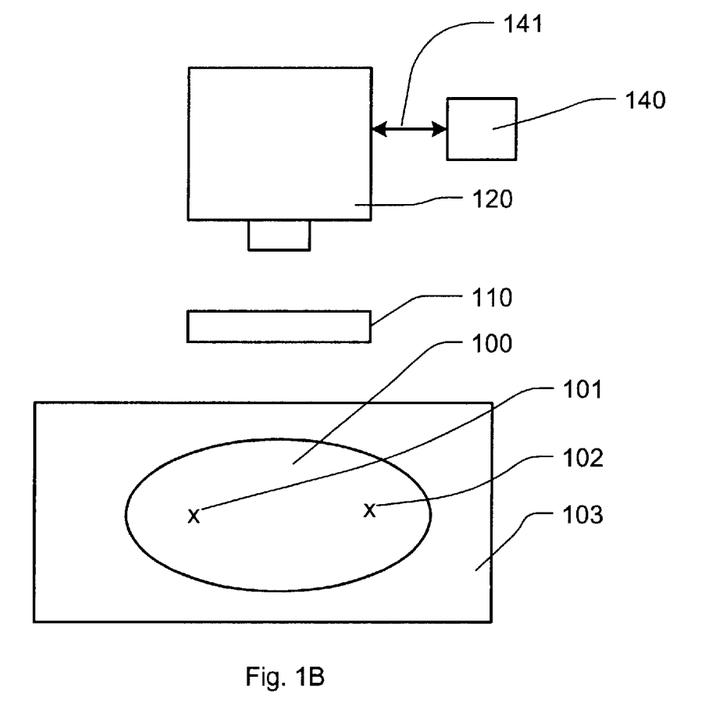
Figure 1C:
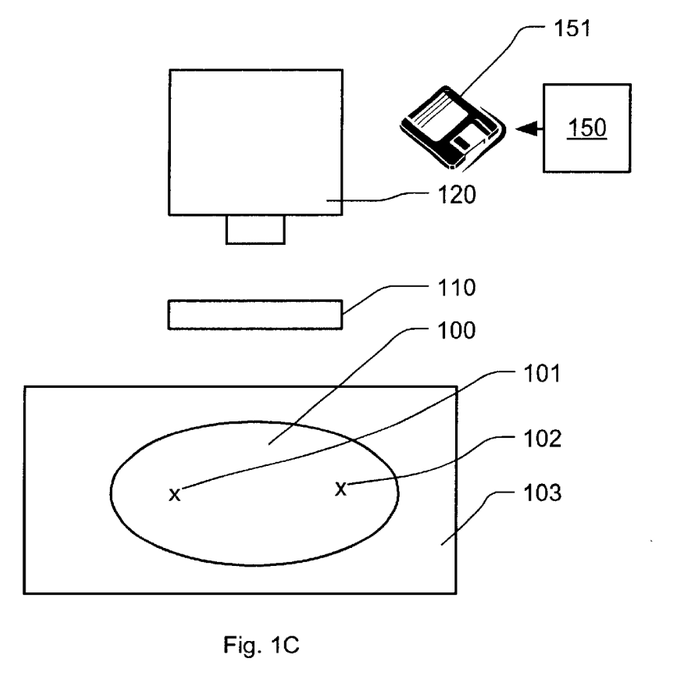

FIGS. 1A, 1B and 1C depict alternative configurations for application of the present invention to a stepper, direct writer or other wafer patterning apparatus. The alternative configurations depicted incorporate the present invention directly into the wafer patterning device, into a device in direct communication with the wafer patterning device, and into a device which provides data to be acted upon by a wafer patterning device. The present invention is adaptable for use with a stepper that exposes a wafer through a reticle, a direct writing device which uses a radiant energy beam to pattern a cell on the wafer surface before stepping to the next cell, or any other apparatus for patterning a wafer cell before stepping to the next cell.

FIG. 1A depicts incorporation of the present invention directly into a wafer patterning device. The wafer 100 has a surface which includes alignment marks 101, 102. The wafer sits on a platform 103 which typically is positioned by stepper motors. In application of the present invention to a photolithographic stepper, a reticle 110 is used. The stepper 120 includes apparatus for reading alignment marks from the surface of a wafer, typically before and after patterning, and for directly a radiant energy beam onto the wafer surface. A processor 130 is coupled with means for locating the alignment marks and means for exposing patterns includes resources and logic to develop an exposure pattern in accordance with the present invention. Any conventional means for locating the alignment marks and any conventional means for exposing patterns on a wafer may be used to practice the method of the present invention.

FIG. 1B depicts an alternative configuration. In this configuration, a processor 140 is in direct communication 141 with the stepper. The processor has access to means for locating the alignment marks and means for exposing patterns. It includes resources and logic to determine an exposure pattern. It transmits exposure pattern data to the stepper which the stepper uses to pattern a wafer. Direct communication between the processor and the stepper allows the pattern determination to proceed with a minimum of user intervention.

FIG. 1C is a variation on the previous figure. In this configuration processor 151 is not in direct communication with the stepper. Data is supplied to the processor describing the position of the alignment marks. Wafer patterning data is generated, for instance on a floppy disk 151, for use in the stepper when patterns are exposed on the wafer surface.

Mathematically, optimal wafer exposure could be treated as a special type of knapsack packing or cutting and packing problem, similar to the problems addressed in Gilmore, P. C., and Gomory, R. E., "A Linear Programming Approach to the Cutting-Stock Problem," *Operations Research*, 9, 849–859 (1961); Gilmore P. C., and Gomory, R. E., "The Theory and Computation of Knapsack Functions," *Operations Research*, 14, 1045–1074 (1966); Beasley, J. E., "Algorithms for Unconstrained Two-Dimensional Guillotine Cutting," *Journal of the Operation Research Society*, 36, 297–306 (1985); Hifi, M. and Zissimopoulos, V., "A Recursive Exact Algorithm for Weighted Two-Dimensional Cutting," *European Journal of Operational Research*, 91, 553–564 (1996); M. Hifi, "A DH/KD Algorithm: A Hybrid Approach for Unconstrained Two-Dimension Cutting Problems," *European Journal of Operational Research*, vol. 97, pp. 41–52 (1997); H. Dyckhoff, "A Typology of Cutting and Packing Problems," *European Journal of Operational Research*, vol. 44, pp. 145–159, 1990; C.-F. Chien and W.-T. Wu, "A Recursive Computational Procedure for Container Loading," *Computers & Industrial Engineering*, vol. 35, pp. 319–322 (October 1998). These references neither formulation not solve the problem as addressed by the present invention.

Recognizing the unique characteristics of the exposure patterning and formulating a problem statement was an important step in developing the present invention. The exposure patterning problem may be easier to solve than problems discussed in the literature when all of the constraints are identified. Several constraints differentiate this problem from the two-dimensional guillotine cutting problem in the literature, e.g., Beasley (1985), Hifi (1997). All the exposed areas (i.e., cells) are the same sized rectangles. One cell usually contains multiple dies. Because of the requirement of the wafer sawing process, each horizontal (and vertical) sawing on a wafer cannot cut into any die. Although all applied cuts are of guillotine type with respect to dies, the applied cut may not be of guillotine type with respect to cells. The number of the exposed cells has no upper bound (i.e., unconstrained). The profit of each die may be the same as another (i.e., unweighted). The two alignment marks that are required for alignment in the lithographic stepper cannot be patterned. The border of the wafer cannot be used to produce good dies. As an exposure field or cell contains multiple dies, a cell which lies partly on the border of the wafer may still produce some dies inside the effective radius. Because wafer throughput depends on the number of cells exposed, a cost-effectiveness ration can be used to determine whether a particular cell should be exposed or not. The shape of the wafers presents an additional constraint for wafers which have a flat bottom edge section, designed for data recording and alignment. These inventors' work is believed to represent the first time that the wafer exposure pattern problem has been characterized by these constraints, leading to a method and apparatus for exposing wafers according to an optimized pattern.

Figure 2:
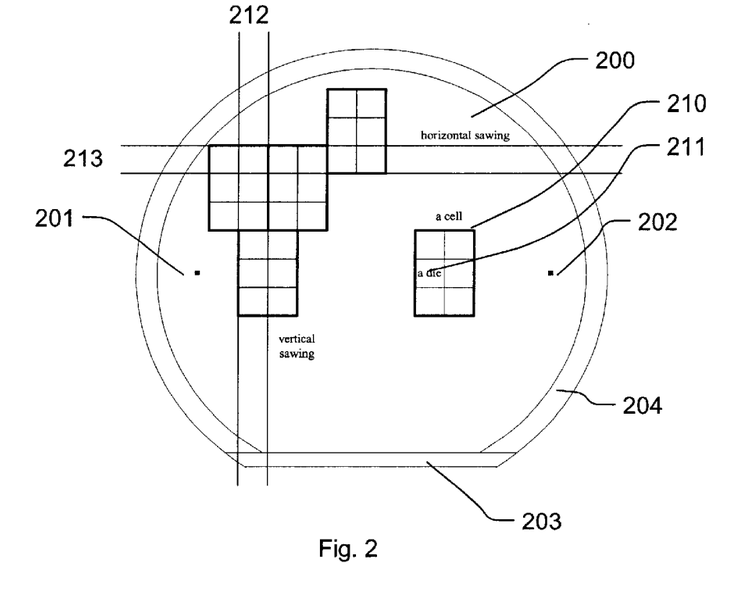
FIG. 2 depicts a six inch wafer and constraints imposed by horizontal and vertical sawing of the wafer.

FIG. 2 depicts a six inch wafer 200 with two alignment marks 201, 202 on its surface. The wafer is generally round, except for a flat 203. Around the perimeter or edge of the wafer, there is unusable region 204. The usable portion of the wafer may be referred to as the effective radius of the wafer. An exposure cell 210 may contain multiple dies 211, in this case six dies. The relationship of cells and dies to vertical and horizontal sawing lines 212, 213 is depicted. Cells must be exposed so that sawing lines divide the cells into dies.

Three embodiments of the present invention are described. The first embodiment is adapted for use with six inch wafers which have a flat. The second and third are adapted for use with eight inch circular wafers. The second and third embodiments apply equally well to larger circular wafers. All embodiments can readily be adapted to wafers with more than two reference points.

FIRST EMBODIMENT

The method and apparatus of the present invention is best understood with the following notation in mind:

N: the number of total iterations.

$z_{ij}$: the starting point of the ith iteration in area j, i=1, 2, ..., N; j=1, 2, 3, 4, 5.

L: the length where $z_{1j}$ may shift horizontally.

d: the shifted distance of the x-axis coordinate of $z_{1j}$ each iteration.

$l_d$: the length of a die.

$w_d$: the width of a die.

$l_c$: the length of a cell. Note that $l_c$ will be a multiple of $l_d$. Let $$k_l = \frac{l_c}{l_d}.$$

$w_c$: the width of a cell. Note that $w_c$ will be a multiple of $w_d$. Let $$k_w = \frac{w_c}{w_d}.$$

k: the number of dies exposed within a cell. That is, $k=k_l \times k_w$.

D: the diameter of the wafer.

r: the effective radius of the wafer, i.e., r=0.5D−the border width.

$L(-x_0, y_0)$: the left alignment mark on the wafer.

$R(x_0, y_0)$: the right alignment mark on the wafer.

$l_e$: the length of the alignment mark.

$w_e$: the width of the alignment mark.

h: the length between the wafer center and the bottom.

[.]: a Gaussian function.

n: the number of cell columns of area 1 (i.e., the maximum number of the columns of cells possibly exposed between two alignment marks).

p: the cost-effective ratio for determining whether a cell lying partly in the borders should be exposed or not. Thus, the ratio of dividing the number of dies that produced from such a cell by k should be no less than p.

Figure 3:
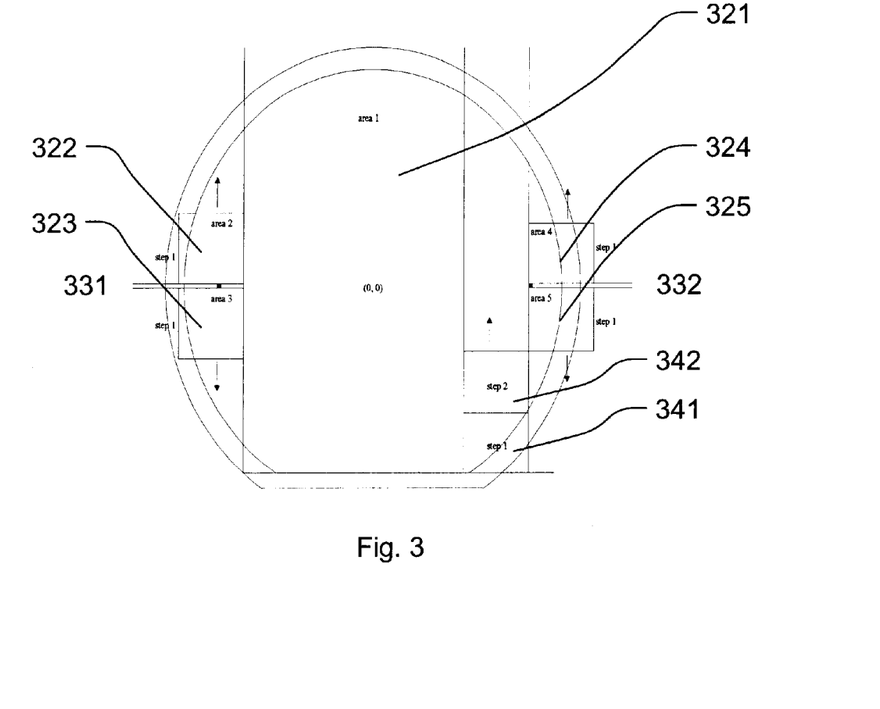
FIG. 3 depicts layout of cells on a six inch wafer in accordance with the present invention.

The present invention may be practiced by first dividing a wafer into five areas (the central area 321 in between the two alignment marks and the other four areas in the four wafer corners) as shown on FIG. 3 and specify the criteria for placing the starting points. The five areas are labeled 321, 322, 323, 324 and 325. In addition, there are two areas 331, 332 which include the alignment points 201, 202. A baseline maybe constructed to orient these areas. For a six inch wafer, the baseline preferably is parallel to the flat edge of the wafer. Alternatively, a baseline may be defined by two alignment marks. The sides of the center area preferably are perpendicular to the baseline. The exposure cells in the center area are labeled 341–42.

To reduce the waste area, the starting point $z_{i1}$ of area 1 should be placed as close to the bottom or flat of the wafer as possible. However, the starting point $z_{i1}$ is allowed to shift horizontally along a baseline within a length L that is the smaller one between one half of the cell width and one half of the remained length by taking n columns of cells from the area between two alignment marks, i.e., $L=\min[0.5(2x_0-nw_c), 0.5w_c]$. Therefore, let $z_{i1}=(x_{i1},-h)$, where $x_{i1}=-x_0+(j-1)d$, $j=1, 2, \ldots, N$. Note that d is the shifted distance of the X-axis coordinate of $z_{i1}$ each iteration, i.e., $$d = \frac{L}{N-1}.$$

The other four areas should be exposed as close to the area 1 and the two alignment marks as possible to reduce the wasted wafer area. Thus, once the starting point in area 1 determined, the X-axis coordinates of the starting points of the other four areas can be determined. Also, because of the requirement of the wafer sawing process, we can also determine the Y-axis coordinates of the starting points of the other four areas. In particular, $z_{i2}=(x_{i2},y_{i2})$ where $x_{i2}=x_{i1}$ and $$y_{i2} = \left(\left[\frac{h+y_0-l_e}{l_d}\right]+1\right) \times l_d;$$

$z_{i3}=(x_{i3},y_{i3})$ where $x_{i3}=x_{i1}$ and $$y_{i3} = \left(\left[\frac{h+y_0-l_e}{l_d}\right]\right) \times l_d;$$

$z_{i4}=(x_{i4},y_{i4})$ where $x_{i4}=x_{i1}+nw_c$ and $$y_{i4} = \left(\left[\frac{h+y_0-l_e}{l_d}\right]+1\right) \times l_d;$$

$z_{i5}=(x_{i5},y_{i5})$ where $x_{i5}=x_{i1}+nw_c$ and $$y_{i5} = \left(\left[\frac{h+y_0-l_e}{l_d}\right]\right) \times l_d.$$

Note that the X-axis coordinates of $z_{i2}$ and $z_{i3}$ ($z_{i4}$ and $z_{i5}$) may be the same; the Y-axis coordinates of $z_{i2}$ and $z_{i4}$ ($z_{i3}$ and $z_{i5}$) may be the same.

Given a starting point $z_{i1}$, we begin with an iteration to determine the exposure patterns of area 1 and the other four areas. The cells are exposed in n vertical columns in area 1, i.e., n=

$$\left[\frac{2x_0}{w_c}\right].$$

Consequently, the other four starting points are determined according to equations (1)–(4) and the cells are then exposed vertically toward the corresponding corners.

Figure 4:
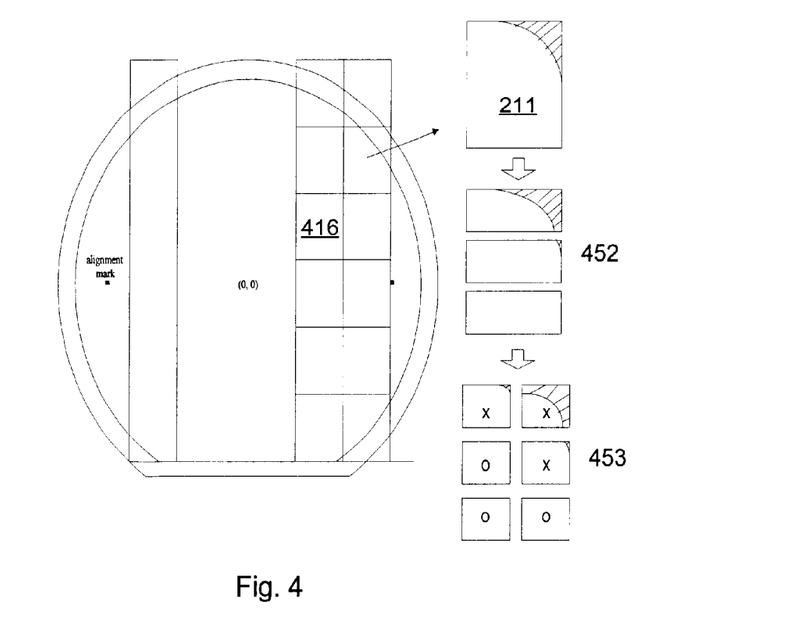
FIG. 4 depicts the yield of dies from a cell which is exposed partially outside the effective radius of the wafer.

FIG. 4 depicts a procedure to calculate the number of cells exposed and the number of dies produced. There are only two situations for which a cell may be exposed: the cell 416 lies completely inside the borders or effective radius of the wafer (i.e., all the k dies produced) and the cell 211 lies partly inside the borders. For the second situation, only a cost-effective cell should be actually exposed. The process may begin with counting the number of exposed cells. Given the coordinates of the four corner points of a particular cell, the Pythagorean Theorem can be used to verify how the cell lies. If a cell lies partly in the borders, it may be to subdivided into $k_w$, rows of strips. Then, the number of dies produced by the ith strip, $m_i$; (i=1, 2, . . . , $k_w$), is obtained by solving a special one-dimensional knapsack problem which is given by:

Maximize $m_i$ subject to $m_i \times w_d \leq w_i$ $m_i \in N$ where $w_i$ is the length of the ith strip that is the smaller one between the top and bottom edges of the ith strip. Indeed, $m_i$ can be also obtained by solving a Gaussian function, i.e., $m_i$=

$$\left[\frac{w_i}{w_d}\right].$$

The best exposure patterns are the best ones among the local optimal solutions of different iterations. The above procedures are readily carried out by a computer program which calculates the optimal solutions and details the specific coordinates of the exposure patterns. The logic to determine optimal solutions and detail exposure patterns may either reside in or outside the stepper.

APPLICATION OF THE FIRST EMBODIMENT

Figure 5:
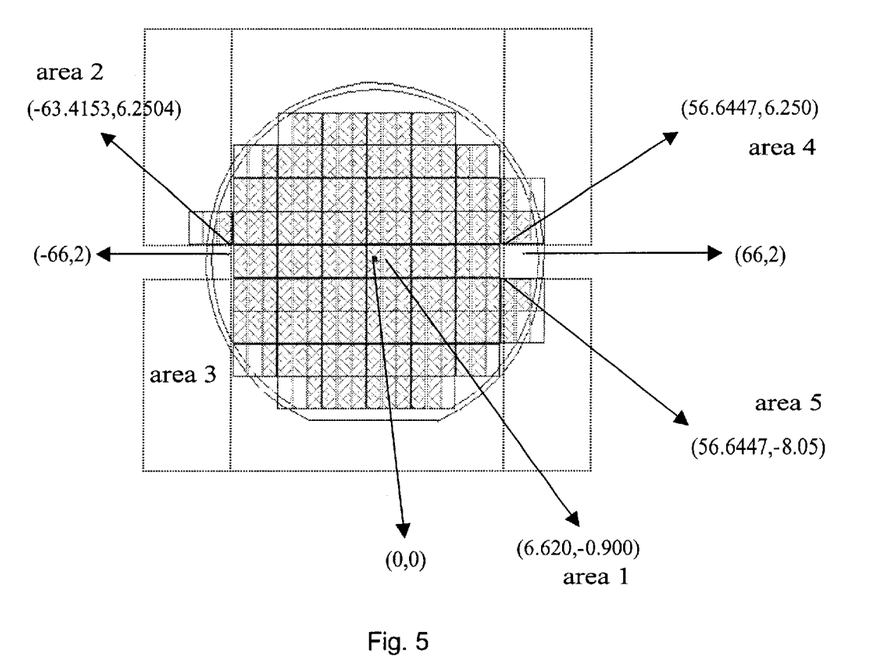
FIG. 5 depicts exposure of a six inch wafer in accordance with the present invention.

An empirical study, depicted in FIG. 5, has been conducted implementing the procedure within a wafer fab. This study verified the effectiveness of the present invention in generating a higher yield than conventional methods. In this study, the diameter of the wafer was 152 mm. The border was 2.5 mm wide. The geometric locations of the two alignment marks were (66, 2) and (−66, 2). The size of each alignment mark was 0.5 mm by 0.5 mm. The cell size of a particular product was 20.01 mm by 14.30 mm. The die size was 6.67 mm by 14.30 mm. Each cell contained 3 dies (i.e., 3 by 1). Cells were to be exposed if at least one die would be produced. In other words, the cost-effective ratio of the exposure was 0.33.

Applying the developed procedure, 50 iterations were executed producing an optimal solution of exposing 55 cells on a wafer to produce 147 dies per wafer, as shown in FIG. 5. An experienced engineer at the fab had been using software provided by the stepper vendor to adjust the exposure pattern manually and expose 51 cells on a wafer to produce only 140 dies per wafer before the study. Application of the present invention yielded a 5.0% extra profit in this study.

Figure 6:
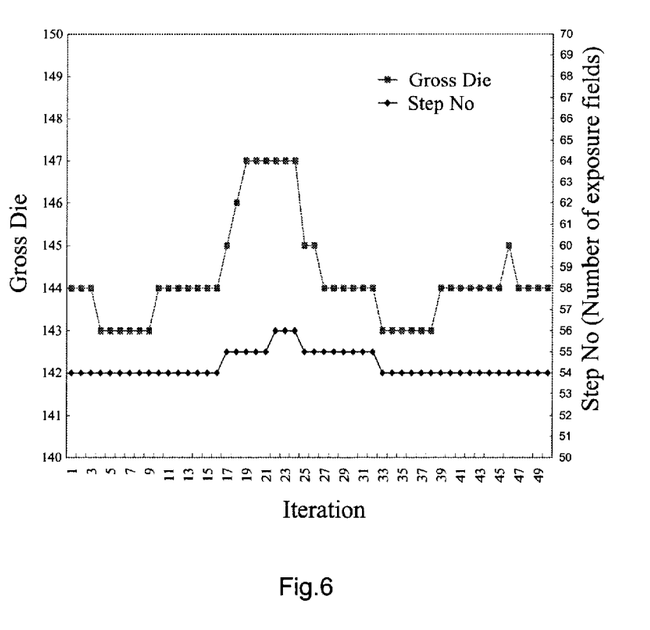
FIG. 6 depicts yields from alternative exposure patterns, calculated in accordance with the present invention.

It was also determined that the method of the present invention usually generates more than one optimal exposure pattern. The optimal solution of the empirical study was fairly robust, as demonstrated by the data in FIG. 6.

One may apply two additional criteria to determine the final exposure pattern: to minimize the number of exposures per wafer (i.e., to reduce the operating cost) and to maximize the distance from good dies to the wafer edge (i.e., to increase yield). Use of computer-based procedure allows detailed sensitivity analysis. A wafer exposure expert system would assist engineers in determining wafer exposure patterns for new products in the fab.

SECOND EMBODIMENT

In discussing the second embodiment, we introduce the following additional notation:

$N_h$: the number of horizontal iterations.
$N_v$: the number of vertical iterations;
H: the length where $z_{1j}$ may shift horizontally.
V: the length where $z_{1j}$ may shift vertically.
Note that n $$n = \frac{2(x_0 - 0.5^* w_e)}{w_c}.$$

Figure 7:
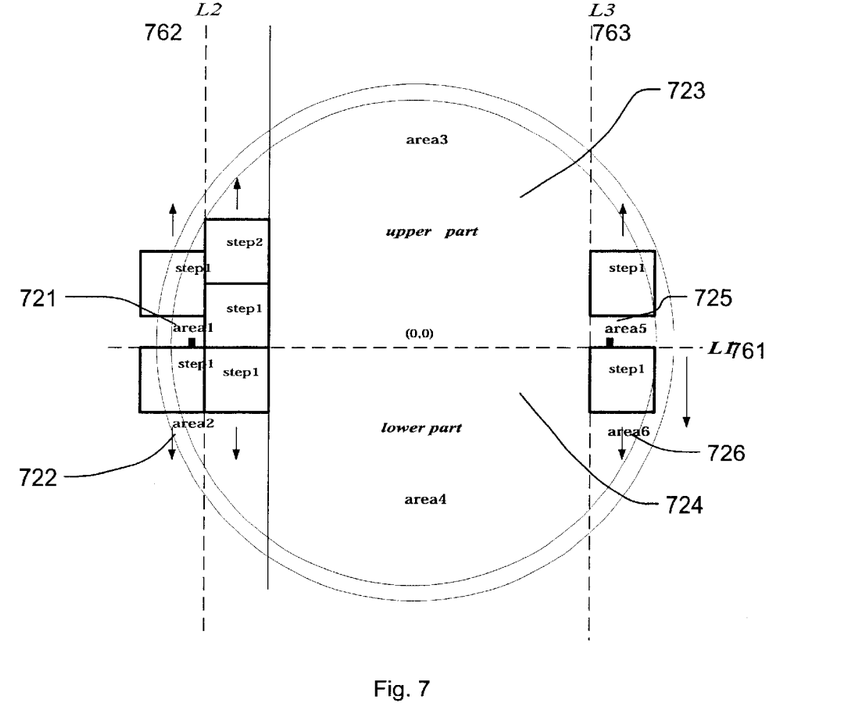
FIG. 7 depicts application of the present invention to an eight inch wafer.

FIG. 7 depicts a second embodiment. In applying the present invention, we divide the wafer into six areas 721–76 (the central two areas 723–724 in between the two alignment marks 701, 702 and the other four areas 721, 722 and 725, 726 in the four wafer corners) and specify the criteria for placing the starting points. We use the three virtual lines (L1, L2, L3) 761–763 to divide the wafer into six areas. Areas 3 and 4 of 723, 724 are in between the two alignment marks and their width is the maximal integral multiple of the cell width. The vertical edges of areas 3 and 4 (determined by L2 and L3) can be moved synchronously between the two alignment marks. The other four areas (i.e., areas 1, 2, 4 and 5) should be exposed as close as possible to areas 3 and 4 in order to reduce wasted area. Horizontal line L1 separates the areas 1, 3, 5 from the other areas 2, 4, and 6. Moving L1 changes the proportion of the upper areas and the bottom areas. The maximum number of cells that can be exposed in between the two alignment spot is calculated as $$n = \left\lceil \frac{2(x_0 - 0.5^* w_e)}{w_c} \right\rceil.$$

Thus, the distance between the two virtual lines L2 and L3 is $n^* w_c$. The distance that L2 and L3 can move synchronously is $H=(x_0-0.5^* w_e)\, 0.5^* n^* w_c$. The vertical distance that L3 should move, constrained by the alignment spots and symmetry of the wafer is $V=0.5^*(l_d-l_e)$. To reduce the waste area, the starting point $z_{i3}$ of area 3 should be placed as close as possible to the virtual lines L1 and L2. When evaluating alternative exposure patterns, the starting point $z_{i3}$ is allowed to shift horizontally within a length H and vertically within a length V. Therefore, let $z_{i3}=(x_{i3}, y_{i3})$, where $x_{i3}=-x_0+0.5^* w_e+(j-1)d_h$, $y_{i3}=y_0-0.5^* l_e+(m-1)d_v$, $j=1,2, N_h, m=1,2, Nv$ For reference, $d_h$ and $d_v$ are the shifted distance of the X-axis coordinate of $z_{i1}$ and Y-axis coordinate of $z_{i3}$ in each iteration, i.e., $$d_h = \frac{H}{N_h - 1}$$

and $$d_v = \frac{V}{N_v - 1}.$$

The other five areas should be exposed as close to area 3 and the two alignment marks as possible to reduce the wasted wafer area. Thus, once the starting point for area 3 has been determined, the X-axis coordinates and the Y-axis coordinates of the starting points of the other five areas can be determined. In particular, $z_{i1}=(x_{i1},y_{i1})$ where $x_{i1}=x_{i3}-w_c$ and $y_{i1}=y_{i3}$;

$z_{i2}=(x_{i2},y_{i2})$ where $x_{i2}=x_{i3}-w_c$ and $y_{i2}=y_{i3}-l_c$;

$z_{i4}=(x_{i4},y_{i4})$ where $x_{i4}=x_{i3}$ and $y_{i4}=y_{i3}-l_c$;

$z_{i5}=(x_{i5},y_{i5})$ where $x_{i5}=x_{i3}+nw_c$ and $y_{i5}=y_{i3}$;

$z_{i6}=(x_{i6},y_{i6})$ where $x_{i6}=x_{i3}+nw_c$ and $y_{i6}=y_{i3}-l_c$.

In these equations, the X-axis coordinates of the corresponding points, i.e., $z_{i1}$ and $z_{i2}$, $Z_{i3}$ and $z_{i4}$, $z_{i5}$ and $z_{i6}$ are the same. Similarly, the Y-axis coordinates of the corresponding points $z_{i2}$, $z_{i4}$ and $z_{i6}$ ($z_{i1}$, $z_{i3}$, and $z_{i5}$) are the same.

Given a starting point $z_{i3}$, the exposure patterns of area 3 and the other five areas can be laid out and evaluated. The cells are exposed in n vertical columns in area 1, i.e., n=

$$\left\lceil \frac{2(x_0 - 0.5^* w_e)}{w_c} \right\rceil.$$

Consequently, the other five starting points are determined according to equations above and then the cells are exposed vertically toward the corresponding corners.

An example of program code which iterates through alternative starting points $z_{i3}$ is as follows:

```
#defineL1_DISTANCE((l_d-l_e)/2)
    #defineL1_START (-(l_e/2))
    for(L1_y=L1_START;
    L1_y>=(L1_START-L1_DISTANCE);
    L1_y-=(L1_DISTANCE/*N_v))
        {
        #defineL2_START (-(x_0-w_e/2))
        #defineL2_DISTANCE(((2*x_0-w_e)-w_c*n)/2)
        for(L2_x=L2_START;
    L2_x<=(L2_START+L2_DISTANCE);
    L2_x+=(L2_DISTANCE/N_h))
            {
            mid_u_ans=middle_upper(L2_x,L1_y);
            mid_d_ans=middle_upper(L2_x,-L1_y);
        left_u_ans=left_upper(L2_x,L1_y);
        left_d_ans=left_lower(L2_x,-L1_y);
        right_u_ans=left_upper(-(L2_x+w_c*n),L1_y);
        right_d_ans=left_lower(-(L2_x+w_c*n),-L1_y);
            }
        }
```

This code includes an outer loop shich adjusts the starting point vertically and an inner loop which adjusts the starting point horizontally. As one of ordinary skill in the art will recognize, the order of nesting in this program code is unimportant to practice of the present invention. The following procedure is useful to calculate the number of cells exposed and the number of dies produced. For each cell plotted, there are only three exposure situations: (1) the cell lies completely inside the borders, i.e., all k dies produced; (2) the cell lies partly in the borders, i.e., less than k dies produced; (3) the cell lies completely outside, i.e., no dies produced. Again, only a cost-effective cell should be actually exposed. Given the coordinates of the four corner points of a plotted cell, the Pythagorean Theorem can be used to verify how the cell lies. Initially, suppose that every cell contains all k dies, and mark the data structure representing each cell accordingly. Then, test to determine whether each die lies partly outside the borders and subtract that one from the total number of dies. The number of dies is readily calculated in this way. A sample code fragment to calculate the number of good dies produced in the middle upper area of the wafer 723 by an exposure pattern follows: int middle_upper_part3(Rectangle bar)

```
{
    int count=0;
    Rectangle die;
    die=bar;
    for(;die.left<bar.right;die.left+=DIE_W)
        {
        die.right=die.left+DIE_W;
        if(!outside(die.left,die.top) && !outside(die.right,die.top)){
            count++;
            }
        }
    return(count);
}
Answer middle_upper_part2(Rectangle cell)
{
    int         barsInCol, barsInCol2,
                diesInCell;
    Rectangle bar;/*a row of dies in a cell*/
    Answer    ans;
    ans.cells=0;
    ans.dies=0;
    bar.left=cell.left;
```

-continued

```
    bar.right=bar.left+CELL_W;
    while(true)
    {
        bar.bottom=cell.bottom;
        barsInCol=getInteriors(bar.left,bar.right,cell.bottom,DIE_L);
        bar.bottom=cell.bottom+barsInCol*DIE_L;
        bar.top=bar.bottom+DIE_L;
        diesInCell=barsInCol*N+
                middle_upper_part3(bar);
        if(diesInCell>=(COST_COEFF*M*N)){
            ans.dies+=diesInCell;
            ans.cells++;
            cell.bottom+=CELL_L;
        }else break;
    }
    return(ans);
}
Answer middle_upper(long L2_x,long L1_y)
{
    Rectangle cell;
    Answer    ans,colans;
    ans.cells=0;
    ans.dies=0;
    cell.bottom=L1_y;
    cell.top=L1_y+CELL_L;
    for(cell.left=L2_x;cell.left<(L2_x+MID_COLS*CELL_W);
    cell.left+=CELL_W)
    {
        cell.right=cell.left+CELL_W;
        colans=countInCol(cell);
        ans.dies+=colans.dies;
        ans.cells+=colans.cells;
    }
    return(ans);
}
```

The function routine middle_upper_part3 accepts as input coordinates of a rectangle and the dimensions of a die. For each die within the rectangular, this routine determines whether the top carners of the die lie outside the effective radius or border of the wafer. Only the top corners of the die need to be tested because area 3 lies above L1. That is, top corners will be outside the effective radius whenever bottom corners are. The routine returns a count of the number of dies within the rectangle that are good. This "part3" routine is invoked by center_upper_part 2. The "part2" routine applies the cost effectiveness ratio to determine whether particular cells are exposed or not and keeps count of both cells exposed and good dies produced.

The exposure patttern used by the patterning device is chosen from among the local optimal solutions of different iterations. A computer program can apply this process iteratively and offer the user a choice of optimal and near optimal solutions. A sample code fragment for outputting optimal or near optimal results follows:
if ((best_ans.dies<ans.dies)||
   (best_ans.dies=ans.dies && ans.cells<=best_ans.cells))
    {
    best_ans=ans;
    best_L1=L1_y;
    best_L2=L2_x;
    printf("better(dies:cells; L1_y:L2_x)=(%d:%d; %1d, %1d)/n", ans.dies, ans.cells,
    L1_y, L2_x);

APPLICATION OF THE SECOND EMBODIMENT

Figure 8:
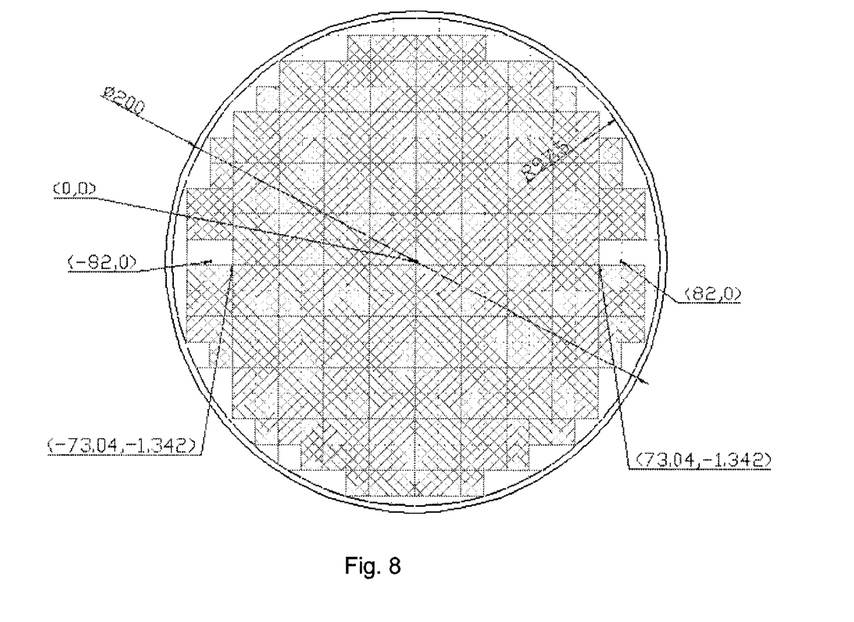
FIG. 8 depicts layout of cells on an eight inch wafer in accordance with the present invention.
Figure 9:
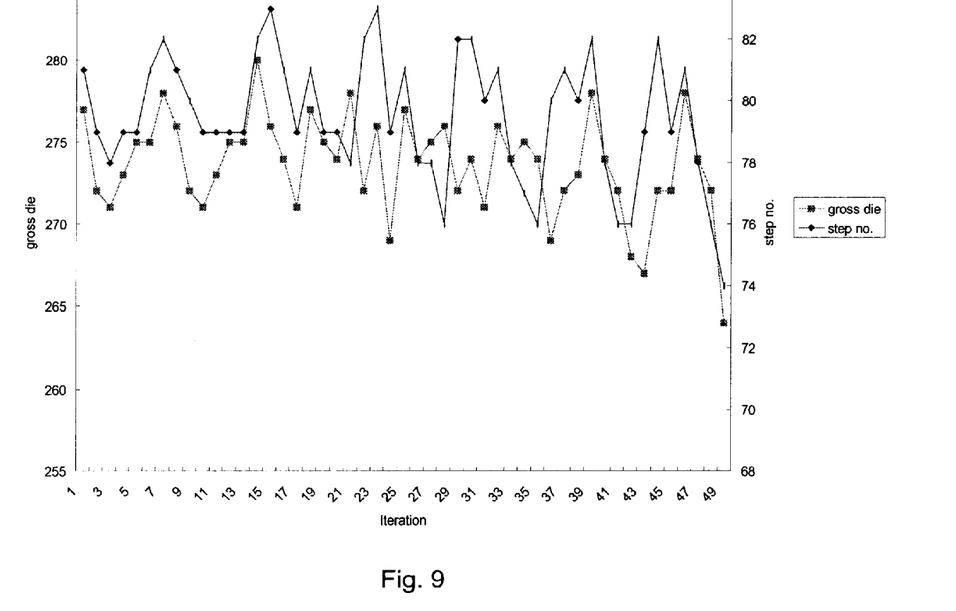
FIG. 9 depicts yields from alternative exposure patterns, calculated in accordance with the present invention.

An empirical study, illustrated in FIGS. 8 & 9, has applied this second embodiment. The diameter of the wafer was 200 mm. The border was 2.5 mm wide. The geometric locations of the two alignment marks were (82, 0) and −82, 0). The size of the alignment mark was 0.8 mm by 0.8 mm. The cell size of a particular product was 18.26 mm by 20.44 mm. The die size of this product was 9.13 mm by 10.22 mm. Each cell contained 4 dies (i.e., 2 by 2). Cells were to be exposed if at least one die (i.e., cost-effective ratio p=0.25) would be produced.

Applying the method of the present invention, 100 iterations were executed and an optimal solution of exposing 82 cells on a wafer to produce 280 dies per wafer was selected. FIG. 8 depicts the exposure pattern selected. Before this study, an experienced engineer using the software provided by the stepper vendor and adjusting the exposure pattern manually was exposing 101 cells on a wafer to produce on 269 dies per wafer. The application of the present invention yielded approximately 4.61% extra profit on this product.

This empirical study again produced several optimal and near optimal exposure patterns. FIG. 9 shows the number of exposures ("step no.") and number of dies produced ("gross dies") for 50 of the exposure patterns tested. As the graph shows, two of 50 patterns produced the maximum number of dies and seven more exposures produced nearly as many dies.

Figure 10:
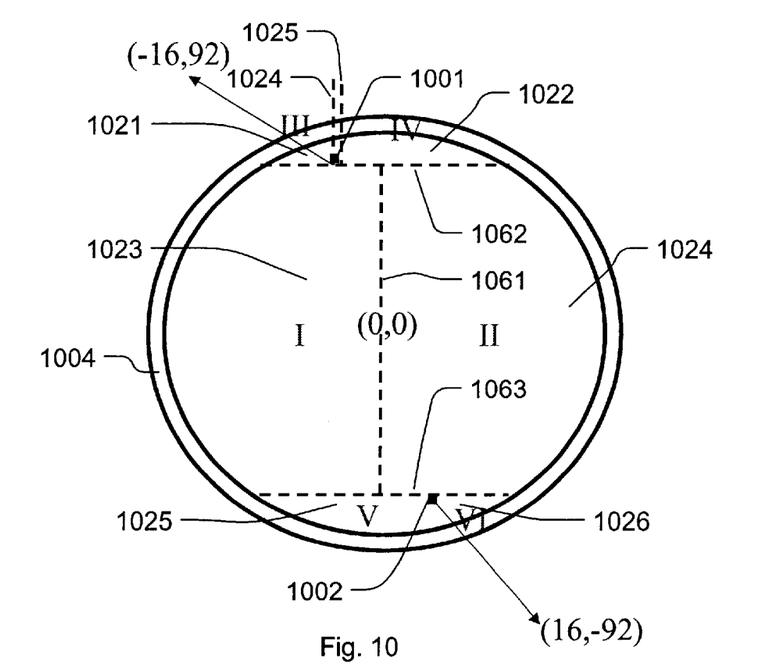

The following table indicates that the present invention is most powerful when the number of dies in a cell, particularly $k_l$ and $k_w$ are large.

coordinate (0, 0). In this instance, the first and second alignment marks are centered at the coordinates (−16, 92) and (16, −92). Because the alignment marks are usually squares (i.e., $w_e=1_e$), their dimensions are $w_e$ by $w_e$. An alignment region encompassing the first alignment mark is defined by the lines 1024, 1025, and 1062. The lines 1024 and 1025 are parallel to the baseline 1061. Corner regions 1021 and 1022 and lie on opposite sides of the alignment region; they are defined by line 1062 and the sides of the alignment region.

Figure 11:
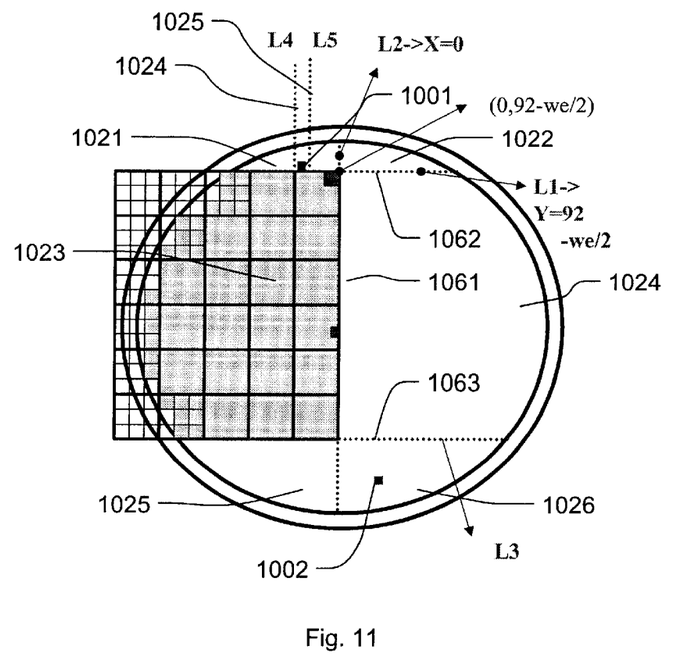
FIGS. 11 and 12 depict a first iteration of cell layout in accordance with the present invention.

FIG. 11 depicts part of the first iteration of placing cells in a pattern. An initial point for iteration is defined at the intersection of lines 1061 and 1062. Line 1062 is offset from the center of alignment mark 1001 by half of the size of the alignment mark, that is we/2. The center regions 1023 and 1024 have a width between the lines 1062 and 1063 which is a multiple of the cell size being exposed. Cells are laid out and the number of dies produced is calculated. Lines 1024 and 1025 are coincident with die boundaries, to satisfy the guillotine cutting constraint for dies and to encompass the alignment mark 1001.

Figure 12:
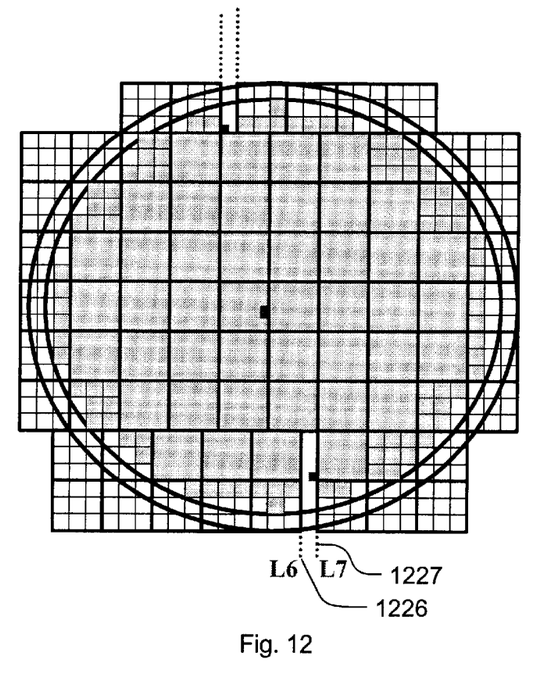

FIG. 12 illustrates the layout of cells in regions other than 1023. Center region 1024, to the right of the origin, is laid out contiguous with center region 1023, to the left of the origin. A second alignment region is defined by lines 1063 and 1026, 1027. Lines 1026 and 1027 are parallel to the baseline 1061 are coincident with die boundaries, to satisfy

TABLE 1

Results of the different products (cost-effective ratio = 0.25)

| Product | Gross die (original) | Gross die (proposed) | Step no. | cell_size x × y (mm × mm) | m × n | die_size x × y (mm × mm) |
|---|---|---|---|---|---|---|
| 1 | 520 | 520 | 142 | 13.78 × 15.216 | 2 × 2 | 6.789 × 7.608 |
| 2 | 182 | 182 | 182 | 11.280 × 12.500 | 1 × 1 | 11.280 × 12.500 |
| 3 | 269 | 280 | 282 | 18.260 × 20.440 | 2 × 2 | 9.130 × 10.220 |
| 4 | 512 | 534 | 96 | 18.260 × 17.280 | 2 × 3 | 9.130 × 5.760 |
| 5 | 432 | 447 | 88 | 14.940 × 23.280 | 3 × 2 | 4.980 × 11.640 |

An advantage of the present invention is that additional criteria can be used to select candidate optimal and near optimal exposure patterns. For instance, the more exposures per wafer the lower throughput is. Dies that are exposed closer to edge have lower yield rate. The two additional criteria may be applied with the present invention to determine a final exposure pattern which minimizes the number of exposures per wafer (i.e., to increase the yield).

THIRD EMBODIMENT

FIG. 10 generally depicts the layout of regions on a wafer when the present invention is practiced in its third embodiment. The wafer depicted is round, such as an eight inch However, practice of the third embodiment does not depend on the wafer being round. A baseline 1061 is set vertical. First and second alignment marks 1001, 1002 are at the top and the bottom of the wafer, offset from the baseline, i.e., $L(-x_o, y_o)$ and $R(x_o, -y_o)$, respectively. There is a border at the wafer edge 1004. According to the third embodiment, the baseline and two lines perpendicular to the baseline 1062, 1063 divide the wafer into center and corner regions 1021–1026. The two horizontal baselines 1062 and 1063 can move synchronously between the two alignment marks. The distance between the two baselines 1062 and 1063 is the length for exposing the maximum rows of cells between two alignment marks. The center of the wafer is assigned the the guillotine cutting constraint and to encompass the alignment mark 1002. The cells in the corner regions are laid out so that dies within the cells are aligned with dies in the center regions. After the cells are laid out, the total number of dies produced is calculated. Only dies within the border of the wafer should be counted. The number of dies produced can be weighted based on a measure of the location of the dies on the wafer, a measure of the distance between dies and the edge of the wafer, or any other weighting scheme including ones which reflect the likelihood than the dies produced will be usable.

Figure 13:
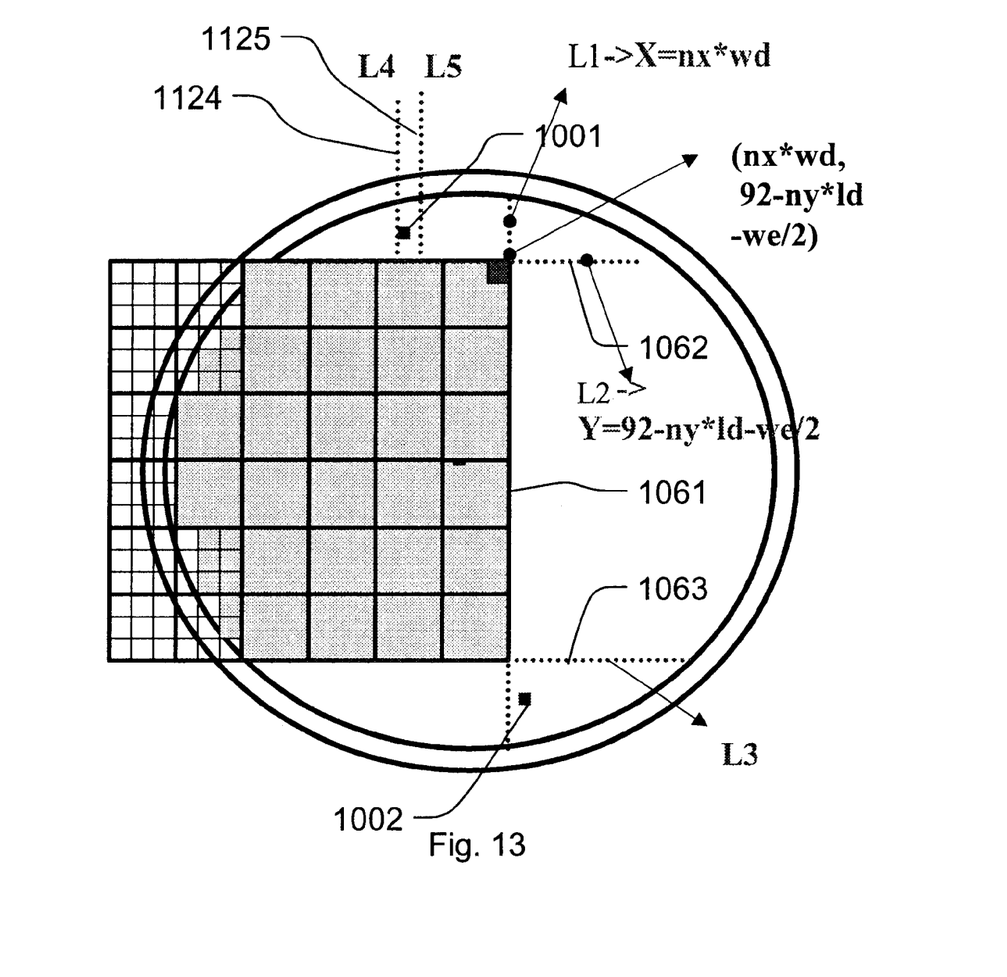
FIG. 13 depicts a second iteration of cell layout in accordance with the present invention.

FIG. 13 illustrates a subsequent iteration of laying out cells in accordance with the present invention. The initial point for iteration is stepped along lines 1061 and 1062 in $N_v$ by $N_h$ iterations. On one hand, the shifted distance of the starting point of an iteration along the X axis, $d_h$, relates to the length where the starting point may shift horizontally, H (i.e., the x-dimension of a cell, $w_c$), divided by the number of iterations, $N_h$. On the other hand, the shifted distance of the starting point of an iteration along the Y axis, $d_v$, relates to the length where the starting point may shift horizontally, V (i.e., V=0.5(2$y_0$—the length for exposing the maximum rows of cells between two alignment marks)), divided by the number of iterations, $N_v$. In particular, the starting point of the first iteration is (0, 92−(we/2)). After n iterations (n=$n_h*n_v$), the starting point of becomes (0+$n_h*d_h$, 92−($w_e$/

2)−($n_v * d_v$)). The sides of the alignment regions, such as sides 1024 and 1025, which encompass the alignment points, such as point 1001, are coincident with die boundaries of cells exposed in the center region for this iteration. After the cells are laid out in all regions, the total number of dies produced is calculated and, if desired, weighted. After the iteration space is exhausted in $N_h$ by $N_v$ iterations, an optimal pattern of cell exposure is selected based on the minimum number of exposures required and the maximum number of complete dies produced. Furthermore, if desired, the aggregation of the weighted dies can be produced for evaluation (for example, considering the spatial distribution of yield rate as the die weighting). Similar approaches may be applied to a variety of products. A computer-based procedure will allow detailed sensitivity analysis with possible (individual and/or simultaneous) changes of various parameters. A database of the optimal wafer exposure patterns of various products can be compiled for reference and benchmarking of new die and reticle designs. A decision support system can utilize compiled data to assist engineers in determining the wafer exposure pattern for existing and planned products and to assist engineers in determining reticle design and other patterning factors.

The foregoing description of various embodiments of the invention has been presented for purposes of illustration and description. The description is not intended to limit the invention to the precise forms disclosed. Many modification and equivalent arrangements will apparent to people skilled in the art.

What is claimed is:

1. A method using a stepper or other wafer patterning device to create a pattern of cells on a surface of a wafer having a baseline, first and second alignment marks and a border at the wafer edge, including the steps:
   defining a pattern on the wafer surface, including
      alignment regions encompassing the first and second alignment marks;
      one or more center regions between the first and second alignment marks, with sides perpendicular to the baseline and a width which is a multiple of a width of said cells;
      corner regions defined by the sides of the center regions and the alignment regions; and
   creating a pattern on the wafer surface with a wafer patterning device using the defined regions.

2. The method of claim 1 wherein the alignment regions extend outward from the alignment marks parallel to said baseline.

3. The method of claim 1 wherein the baseline passes line through the alignment marks.

4. The method of claim 1 wherein the wafer has a flat edge and the baseline is parallel to said flat edge.

5. The method of claim 1 further including the steps of test locating cell exposures in center regions and selecting a preferred cell pattern.

6. The method of claim 5 wherein selecting a preferred cell pattern includes evaluating the number of exposures and the quality of the cells created.

7. The method of claim 5 wherein the cells created comprise one or more dies and selecting a preferred cell pattern includes calculating the number of dies inside the border of the wafer.

8. The method of claim 5 wherein the cells created comprise one or more dies and selecting a preferred cell pattern includes a measure based on the location of the dies on the wafer.

9. The method of claim 5 wherein the cells created comprise one or more dies and selecting a preferred cell pattern includes a measure based on the distance between the die and the edge of the wafer.

10. The method of claim 1 further including the steps of test locating the center regions at locations along the baseline.

11. The method of claim 10 further including the steps of test locating cell exposures in the center and corner regions and selecting a preferred cell pattern.

12. The method of claim 11 wherein selecting a preferred cell pattern includes evaluating the number of exposures and the quality of the cells created.

13. The method of claim 11 wherein the cells created comprise one or more dies and selecting a preferred cell pattern includes counting the number of dies inside the border of the wafer.

14. The method of claim 11 wherein the cells created comprise one or more dies and selecting a preferred cell pattern includes a measure based on the location of the dies on the wafer.

15. The method of claim 11 wherein the cells created comprise one or more dies and selecting a preferred cell pattern includes a measure based on the distance between the die and the edge of the wafer.

16. A method of transmitting an exposure pattern from a processor to a stepper or other wafer patterning device used to create a pattern of cells on a surface of a wafer having a baseline, first and second alignment marks and a border at the wafer edge, including the steps:
   receiving in the processor the locations of the first and second alignment marks and the border at the wafer edge;
   defining a pattern on the wafer surface, including
      alignment regions encompassing the first and second alignment marks;
      one or more center regions between the first and second alignment marks, with sides perpendicular to the baseline and a width which is a multiple of a width of said cells;
      corner regions defined by the sides of the center regions and the alignment regions; and
   transmitting the defined pattern from the processor to a wafer patterning device.

17. The method of claim 16 further including the step of creating a pattern on the wafer surface using the defined regions.

18. The method of claim 16 wherein the alignment regions extend outward from the alignment marks parallel to said baseline.

19. The method of claim 16 wherein the baseline passes line through the alignment marks.

20. The method of claim 16 wherein the wafer has a flat edge and the baseline is parallel to said flat edge.

21. The method of claim 16 further including the steps of test locating cell exposures in the center regions and selecting a preferred cell pattern.

22. The method of claim 21 wherein selecting a preferred cell pattern includes evaluating the number of exposures and the quality of the cells created.

23. The method of claim 21 wherein the cells created comprise one or more dies and selecting a preferred cell pattern includes calculating the number of dies inside the border of the wafer.

24. The method of claim 21 wherein the cells created comprise one or more dies and selecting a preferred cell pattern includes a measure based on the location of the dies on the wafer.

25. The method of claim 21 wherein the cells created comprise one or more dies and selecting a preferred cell pattern includes a measure based on the distance between the die and the edge of the wafer.

26. The method of claim 16 further including the steps of test locating the center regions at locations along the baseline.

27. The method of claim 26 further including the steps of test locating cell exposures in the center and corner regions and selecting a preferred cell pattern.

28. The method of claim 27 wherein selecting a preferred cell pattern includes evaluating the number of exposures and the quality of the cells created.

29. The method of claim 27 wherein the cells created comprise one or more dies and selecting a preferred cell pattern includes counting the number of dies inside the border of the wafer.

30. The method of claim 27 wherein the cells created comprise one or more dies and selecting a preferred cell pattern includes a measure based on the location of the dies on the wafer.

31. The method of claim 27 wherein the cells created comprise one or more dies and selecting a preferred cell pattern includes a measure based on the distance between the die and the edge of the wafer.

32. A method of preparing an exposure pattern to be communicated from a processor to a stepper or other wafer patterning device used to create a pattern of cells on a surface of a wafer having a baseline, first and second alignment marks and a border at the wafer edge, including the steps:

receiving in the processor the locations of the first and second alignment marks and the border at the wafer edge;

defining a pattern on the wafer surface, including
alignment regions encompassing the first and second alignment marks;
one or more center regions between the first and second alignment marks, with sides perpendicular to the baseline and a width which is a multiple of a width of said cells;
corner regions in quadrants defined by the sides of the center regions and the reference regions; and recording the defined pattern on memory.

33. The method of claim 32 further including the steps of transferring the defined pattern from the memory to a wafer patterning device and creating a pattern on the wafer surface using the defined regions.

34. The method of claim 32 wherein the alignment regions extend outward from the alignment marks parallel to said baseline.

35. The method of claim 32 wherein the baseline passes line through the alignment marks.

36. The method of claim 32 wherein the wafer has a flat edge and the baseline is parallel to said flat edge.

37. The method of claim 32 further including the steps of test locating cell exposures in the center regions and selecting a preferred cell pattern.

38. The method of claim 37 wherein selecting a preferred cell pattern includes evaluating the number of exposures and the quality of the cells created.

39. The method of claim 37 wherein the cells created comprise one or more dies and selecting a preferred cell pattern includes calculating the number of dies inside the border of the wafer.

40. The method of claim 37 wherein the cells created comprise one or more dies and selecting a preferred cell pattern includes a measure based on the location of the dies on the wafer.

41. The method of claim 37 wherein the cells created comprise one or more dies and selecting a preferred cell pattern includes a measure based on the distance between the die and the edge of the wafer.

42. The method of claim 32 further including the steps of test locating the center regions at locations along the baseline.

43. The method of claim 42 further including the steps of test locating cell exposures in the center and corner regions and selecting a preferred cell pattern.

44. The method of claim 43 wherein selecting a preferred cell pattern includes evaluating the number of exposures and the quality of the cells created.

45. The method of claim 43 wherein the cells created comprise one or more dies and selecting a preferred cell pattern includes counting the number of dies inside the border of the wafer.

46. The method of claim 43 wherein the cells created comprise one or more dies and selecting a preferred cell pattern includes a measure based on the location of the dies on the wafer.

47. The method of claim 43 wherein the cells created comprise one or more dies and selecting a preferred cell pattern includes a measure based on the distance between the die and the edge of the wafer.

* * * * *